(12) United States Patent
Poh et al.

(10) Patent No.: US 6,324,066 B1
(45) Date of Patent: Nov. 27, 2001

(54) SURFACE MOUNTABLE ELECTRONIC DEVICE

(75) Inventors: Ban Choong Poh; Kean Seong Hooi; Lay Choo Ch'ng, all of Penang (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/356,435

(22) Filed: Jul. 19, 1999

(51) Int. Cl.⁷ ................................................ H05K 7/02
(52) U.S. Cl. ................ 361/760; 361/763; 361/765–767; 361/308.1; 361/309
(58) Field of Search .................... 361/760, 763, 361/765–767, 773, 774, 308.1, 307, 309, 310

(56) References Cited

U.S. PATENT DOCUMENTS

| | | | |
|---|---|---|---|
| 3,668,478 | * 6/1972 | Fabricius | 361/792 |
| 4,648,087 | * 3/1987 | Scranton et al. | 360/103 |
| 4,994,782 | * 2/1991 | Watanabe et al. | 338/160 |
| 5,119,063 | * 6/1992 | Nonnenmacher et al. | 338/159 |
| 5,220,194 | * 6/1993 | Golio et al. | 257/601 |
| 5,257,004 | * 10/1993 | Sakaguchi et al. | 338/188 |
| 5,345,361 | * 9/1994 | Billotte et al. | 361/313 |
| 5,425,647 | * 6/1995 | Mencik et al. | 439/83 |
| 5,468,919 | * 11/1995 | Shiozaki et al. | 174/261 |
| 5,683,788 | * 11/1997 | Dugan et al. | 428/209 |
| 5,706,177 | * 1/1998 | Nather et al. | 361/768 |
| 5,877,672 | * 3/1999 | Tsuda et al. | 338/22 |

* cited by examiner

Primary Examiner—Leo P. Picard
Assistant Examiner—David Foster
(74) Attorney, Agent, or Firm—Frank M. Scutch, III

(57) ABSTRACT

A surface mountable electronic device (1) includes a mount (2), an electrical component (3) supported by the mount and two external terminals (5, 5a) electrically coupled to the component, the external terminals being mounted on the mount at diagonally opposite corners. The device is orientation dependent relative to solder pads (6) on a substrate (7) in that the device can be rotated through 90° about a central axis (8) in either direction and still allow alignment between the external terminals of the device and the substrate solder pads.

2 Claims, 3 Drawing Sheets

SURFACE MOUNTABLE ELECTRONIC DEVICE

FIELD OF THE INVENTION

This invention is concerned with surface mountable electronic devices and particularly, although not exclusively, to the design and configuration of such devices to assist in robotic assembly procedures utilizing such devices.

BACKGROUND OF THE INVENTION

Typically, in robotic assembly of electronic devices to a substrate, such devices, including capacitors, resistors and the like, are loaded into a magazine for sequential delivery to a substrate for attachment via solderable terminals.

Many electronic devices typically have terminals on opposed sides of the device and thus robotic assembly arms must include sensors to ensure correct orientation of the device terminals if incorrect orientation is to be avoided between the device and solder pads on the substrate.

U.S. Pat. No. 5,345,361 describes a rectangular capacitor configuration having terminals on opposed sides relation to the longitudinal axis of the capacitor body.

In transfer of an electronic device from a magazine to a substrate, a delay of some milliseconds can occur while the sensors associated with the robotic arm determine the precise configuration and location of terminals on the device.

SUMMARY OF THE INVENTION According to the present invention there is provided:

a surface mountable electronic device including:

a mount;

an electrical component supported by said mount; and two external terminals electrically coupled to said component, said external terminals being mounted to said mount, wherein said external terminals are of a shape and configuration to allow for mounting in a first position each of said external terminals to a respective one of two conductive pads on a substrate surface, and wherein when said device is rotated ninety degrees in one direction about a central axis thereof that is normal to said substrate surface, said shape and configuration of said external terminals also allows for mounting each of said external terminals to a respective one of said pads.

Suitably, when said device is rotated ninety degrees from said first position in an opposite direction about said central axis, said shape and configuration of said external terminals allows for mounting of said external terminals to opposite respective pads and for interchanging said mounting of said external terminals to respective pads.

Preferably, said mount is rectangular and said external terminals are located in diagonally opposite corners thereof.

Suitably, said external terminals are shaped to form caps on said corners.

Suitably, said external terminals have a substantially triangular surface area.

Preferably, said component is electrically orientation independent.

Suitably, said component is a capacitor. In one alternative form, said component may preferably be an inductor. In another alternative form, said component may suitably be a resistor.

Preferably, said mount is a housing enclosing said component. Alternatively, said component may be mounted on an outer surface of said mount.

BRIEF DESCRIPTION OF THE DRAWINGS

In order that the invention may be more fully understood and put into practical effect, a preferred embodiment will now be described with reference to the accompanying drawings in which.

DETAILED DESCRIPTION OF THE DRAWINGS

Figure 1:
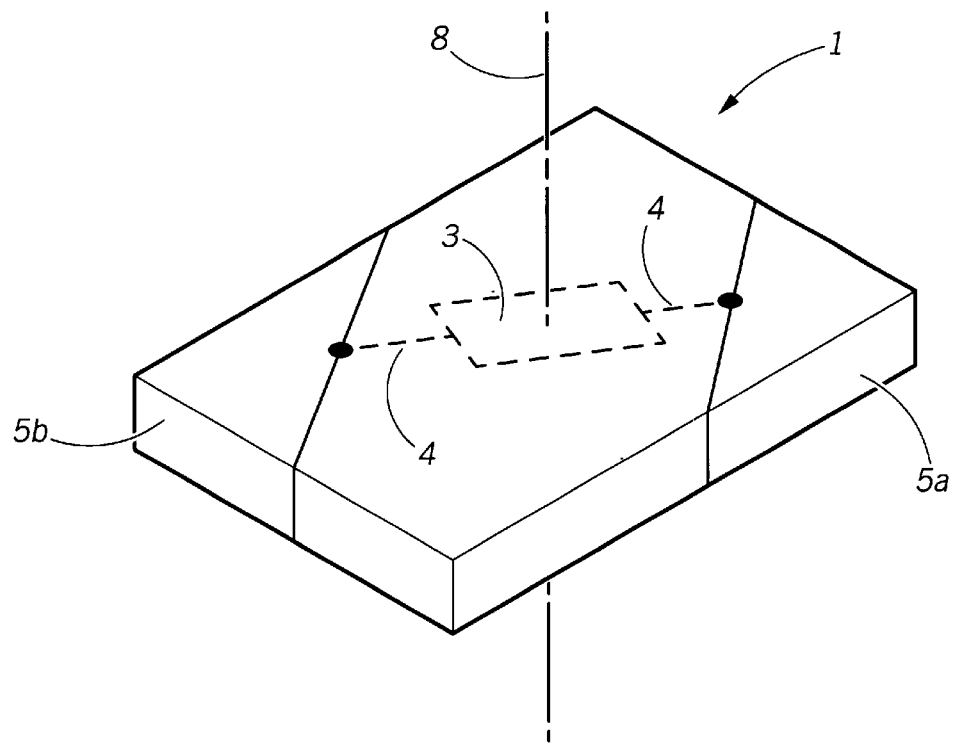
FIG. 1 is a perspective view of a surface mountable electronic device according to the invention.

For the sake of simplicity, like features employ like reference numerals in FIGS. 1 to 5.

In FIG. 1, there is illustrated a surface mountable electronic device 1 that comprises a mount in the form of a housing 2 having located therein an electronic component 3 such as a capacitor, resistor or other electronic component.

Component 3 has conductors 4 electrically coupled with opposed external terminals 5a and 5b located diagonally opposite each other on the housing 2 whereby opposed major faces of device 1 are identical. External terminals 5a, and 5b are formed as triangular caps.

Figure 2:
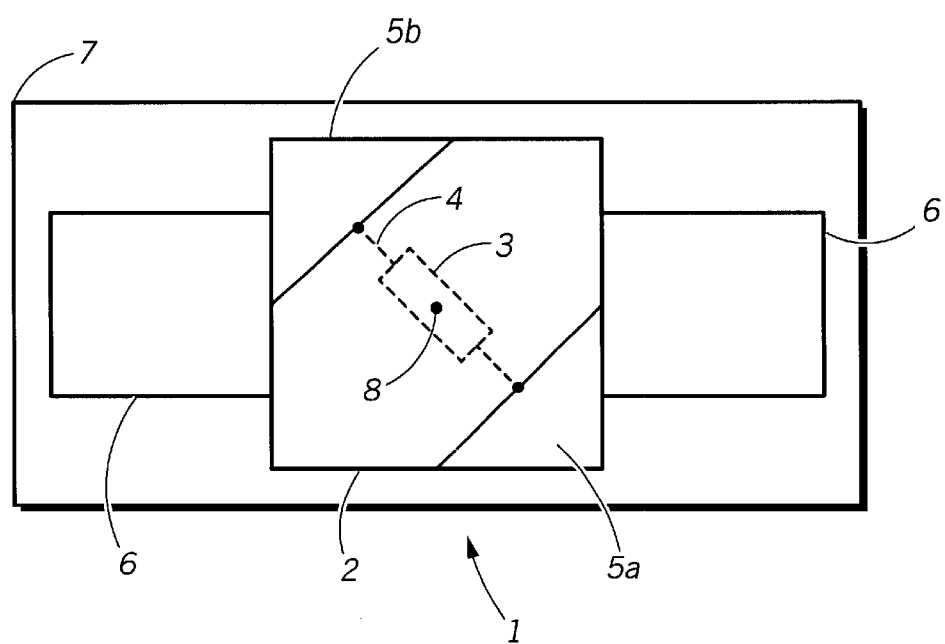
FIG. 2 is a partial plan view of the device of FIG. 1 oriented in a first position with solder pads of a substrate.

FIG. 2 shows one orientation of the device 1 in relation to solder pads 6 of a substrate 7, typically a printed circuit board.

Figure 3:
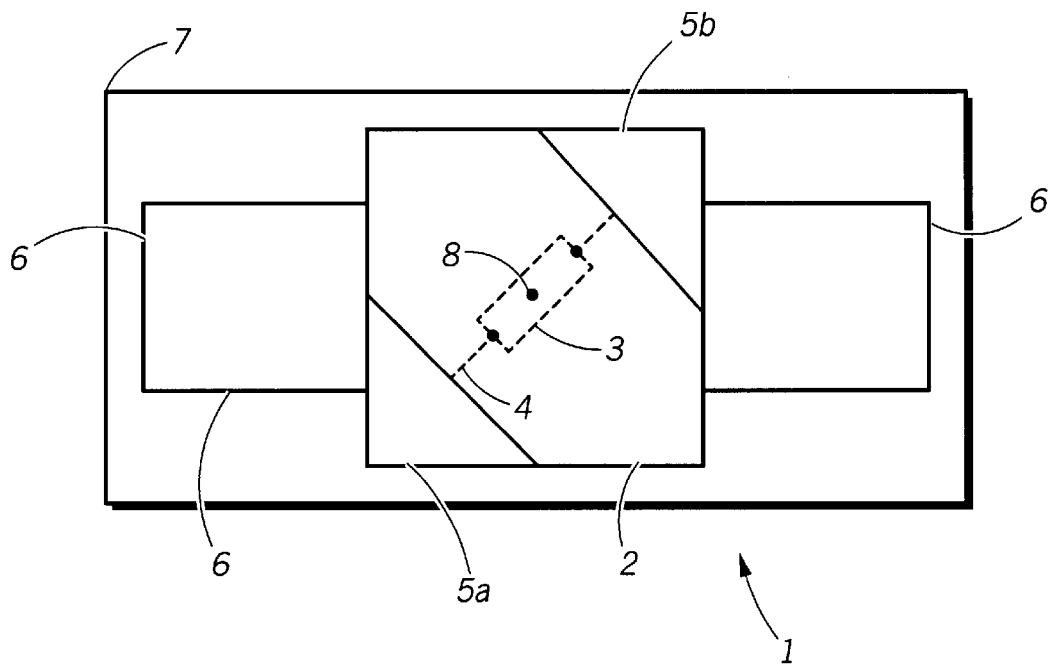
FIG. 3 is a partial plan view of the device of FIG. 1 oriented at 90° to the device of FIG. 2 relative to the substrate solder pads.

FIG. 3 shows the same device 1 rotated in a clockwise direction about an upright axis 8 through 90° relative to solder pads 6.

Figure 4:
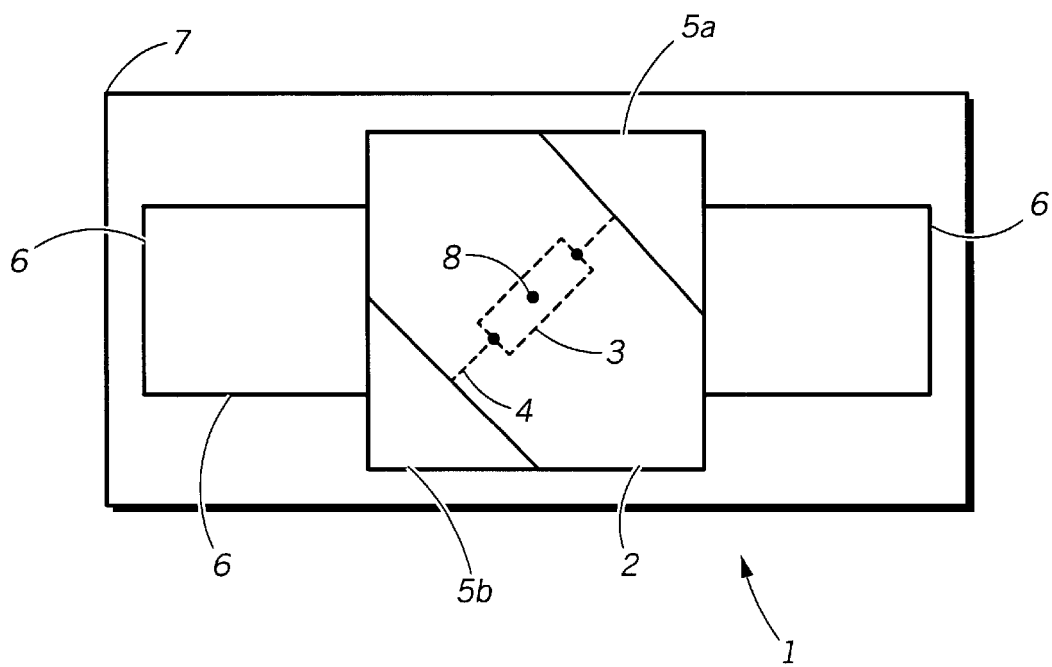
FIG. 4 is a partial plan view of the device of FIG. 1 oriented at 90° in an opposite direction relative to the solder pads.

FIG. 4 shows the same device 1 rotated in an anticlockwise direction about upright axis 8 through 90° relative to solder pads 6.

It immediately will be apparent to a person skilled in the art that the shape and configuration of the surface mountable electronic device 1 with diagonally located external terminals 5a, and 5b is orientation independent with respect to the solder pads 6 of the substrate.

Regardless of which opposed major face of device 1 is directed towards the solder pads 6 of substrate 7, opposed external terminals 5a, and 5b of device 1 will always come into contact with respective solder pads 6.

By removal of orientation dependence of surface mountable electronic devices, the time previously taken to sense the position and orientation of external terminals on a device prior to placement on the solder pads of a substrate is substantially eliminated, thereby increasing production rates of a robotic assembly lines.

It also will be readily apparent to a skilled addressee that many modifications and variations may be made to the invention without departing from the spirit and scope thereof.

Figure 5:
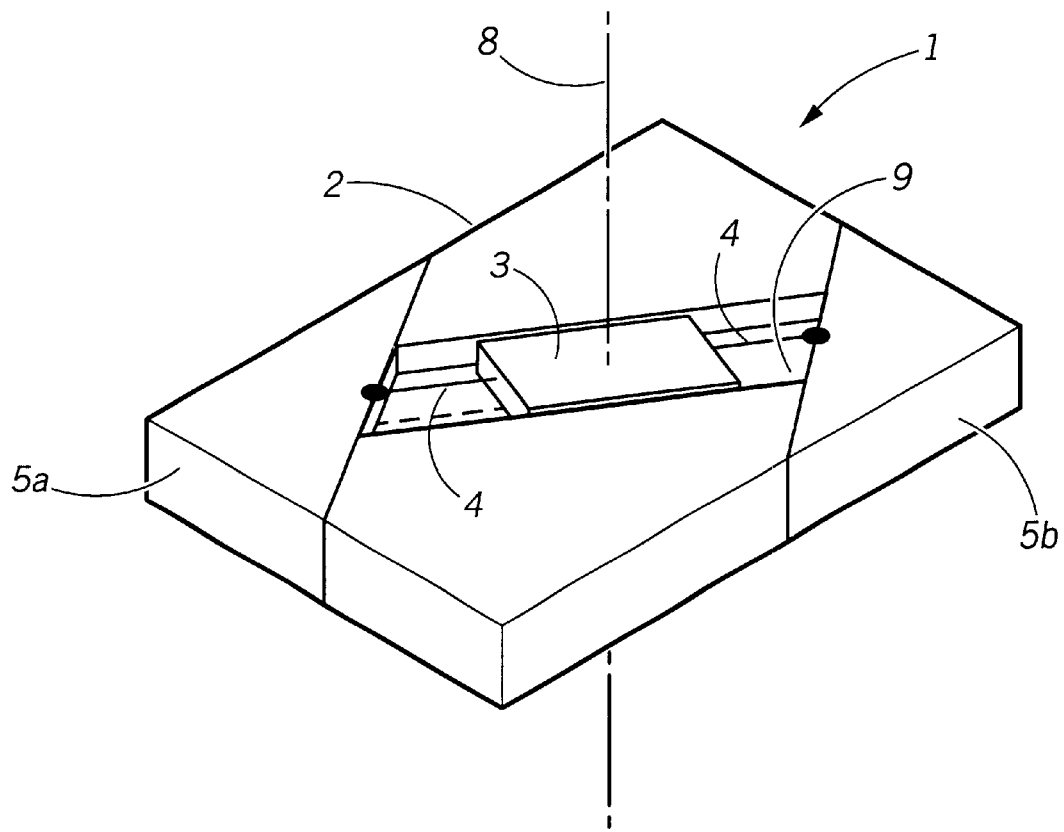
FIG. 5 is a perspective view of an alternative surface mountable electrode according to the invention.

For example, FIG. 5 shows a surface mountable electronic device 1 comprising a housing 2 having an associated electronic component 3 such as a capacitor, resistor or other electronic component.

Component 3 has conductors 4 electrically coupled with opposed external terminals 5a and 5b located diagonally opposite each other on the housing 2.

In this embodiment, the device 1 of FIG. 5 differs from the device 1 of FIG. 1 in that component 3 is located externally of housing 2 in a recess 9 with conductors 4 electrically coupling component 3 with diagonally opposed external terminals 5a and 5b.

What is claimed is:

1. A surface mountable electronic device including:

a rectangular mount;

an electrical component supported by said mount; and two external terminals electrically coupled to said component, said external terminals being mounted to said mount at diagonally opposite corners thereof and shaped to form caps on said corners;

wherein said external terminals are of a shape and configuration to allow for mounting in a first position each of said external terminals to a respective one of two conductive pads on a substrate surface; and wherein when said device is rotated ninety degrees in one direction about a central axis thereof that is normal to said substrate surface, said shape and configuration of said external terminals also allows for mounting each of said external terminals to a respective one of said pads, and when said device is rotated ninety degrees from said first position in an opposite direction about said central axis, said shape and configuration of said external terminals allows for mounting of said external terminals to opposite respective pads and for interchanging said mounting of said external terminals to respective pads.

2. A surface mountable electronic device including:

a rectangular mount;

an electrical component supported by said mount; and two external terminals electrically coupled to said component, said external terminals having a substantially triangular surface area and being mounted to said mount at diagonally opposite corners thereof and shaped to form caps on said corners;

wherein said external terminals are of a shape and configuration to allow for mounting in a first position each of said external terminals to a respective one of two conductive pads on a substrate surface; and wherein when said device is rotated ninety degrees in one direction about a central axis thereof that is normal to said substrate surface, said shape and configuration of said external terminals also allows for mounting each of said external terminals to a respective one of said pads, and when said device is rotated ninety degrees from said first position in an opposite direction about said central axis, said shape and configuration of said external terminals allows for mounting of said external terminals to opposite respective pads and for interchanging said mounting of said external terminals to respective pads.

* * * * *